United States Patent
Kim et al.

(10) Patent No.: US 9,281,487 B2
(45) Date of Patent: Mar. 8, 2016

(54) WHITE ORGANIC LIGHT EMITTING DIODE DEVICE

(71) Applicant: LG Display Co., Ltd., Seoul (KR)

(72) Inventors: Shinhan Kim, Seoul (KR); Byungchul Ahn, Seoul (KR); Changwook Han, Seoul (KR); Dohyung Kim, Seoul (KR); Hongseok Choi, Seoul (KR); Sunghoon Pieh, Seoul (KR); Yoonheung Tak, Goyang-si (KR); Jeongdae Seo, Incheon (KR); Youngkwan Jung, Daegu (KR); Gwijeong Cho, Daegu (KR); Younseok Kam, Seoul (KR); Taeshick Kim, Yongin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/339,168

(22) Filed: Jul. 23, 2014

(65) Prior Publication Data

US 2015/0034923 A1 Feb. 5, 2015

(30) Foreign Application Priority Data

Jul. 31, 2013 (KR) .......................... 10-2013-0091063

(51) Int. Cl.
*H01L 51/00* (2006.01)
*H01L 51/50* (2006.01)
*H01L 27/32* (2006.01)

(52) U.S. Cl.
CPC ........ *H01L 51/5004* (2013.01); *H01L 27/3209* (2013.01); *H01L 51/5044* (2013.01); *H01L 51/504* (2013.01); *H01L 2251/5376* (2013.01)

(58) Field of Classification Search
CPC .................................................. H01L 51/5004
See application file for complete search history.

(56) References Cited

U.S. PATENT DOCUMENTS 5,274,248 A * 12/1993 Yokogawa ............. B82Y 20/00
257/103
5,552,253 A * 9/1996 Kovacs .................. G03G 5/043
430/54

(Continued)

FOREIGN PATENT DOCUMENTS

JP 2008-532229 A 3/2008
JP 2009-500790 A 1/2009

(Continued)

OTHER PUBLICATIONS

Rosenow et al., "Highly efficient white organic light-emitting diodes based on fluorescent blue emitters," Journal of Applied Physics, vol. 108, No. 11, 2010, pp. 113113-1 to 113113-5.

*Primary Examiner* — Ida M Soward
(74) *Attorney, Agent, or Firm* — Birch, Stewart, Kolasch & Birch, LLP

(57) ABSTRACT

Provided is a white organic light emitting diode device, including first and second electrodes facing each other above a substrate, first and second charge generation layers formed between the first electrode and the second electrode, a first stack disposed between the first electrode and the first charge generation layer and including a first light emitting layer, a second stack disposed between the first charge generation layer and the second charge generation layer and including a second light emitting layer, and a third stack disposed between the second charge generation layer and the second electrode and including a third light emitting layer, wherein two of the first to third light emitting layers emit a blue light and the rest light emitting layer emits a yellow-green light.

13 Claims, 7 Drawing Sheets

(56) References Cited

U.S. PATENT DOCUMENTS

| | | | |
|---|---|---|---|
| 5,727,014 A * | 3/1998 | Wang | H01S 5/18355 372/108 |
| 5,757,447 A * | 5/1998 | Kobayashi et al. | G02F 1/133604 313/487 |
| 6,090,511 A * | 7/2000 | Yang et al. | 430/57.2 |
| 6,406,823 B2 * | 6/2002 | Melnyk | G03G 5/047 430/46.2 |
| 7,158,161 B2 * | 1/2007 | Gyoutoku | H01L 51/5278 347/130 |
| 7,696,681 B2 * | 4/2010 | Park | H01L 27/3209 313/503 |
| 7,859,186 B2 * | 12/2010 | Noh et al. | 313/504 |
| 8,476,624 B1 * | 7/2013 | Wu et al. | 257/40 |
| 8,564,190 B2 * | 10/2013 | Seo et al. | 313/504 |
| 8,963,143 B2 * | 2/2015 | Loebl | H01L 51/5076 257/103 |
| 9,130,184 B2 * | 9/2015 | Seo | H01L 51/0085 |
| 2004/0227460 A1 | 11/2004 | Liao et al. | |
| 2006/0188745 A1 | 8/2006 | Liao et al. | |
| 2007/0001587 A1 | 1/2007 | Hatwar et al. | |
| 2010/0066239 A1 | 3/2010 | Spindler et al. | |
| 2011/0215308 A1 * | 9/2011 | Im | H01L 51/006 257/40 |
| 2012/0235131 A1 | 9/2012 | Okamoto | |
| 2012/0248971 A1 * | 10/2012 | Okuyama | 313/504 |
| 2013/0092909 A1 | 4/2013 | Han et al. | |
| 2013/0134410 A1 * | 5/2013 | Kim | 257/40 |
| 2013/0153881 A1 * | 6/2013 | Tokoo | H01L 51/5096 257/40 |
| 2014/0084269 A1 * | 3/2014 | Weaver | H01L 27/3209 257/40 |
| 2015/0200378 A1 * | 7/2015 | Reusch | H01L 51/5278 257/40 |

FOREIGN PATENT DOCUMENTS

| | | |
|---|---|---|
| JP | 2012-503294 A | 2/2012 |
| JP | 2012-146764 A | 8/2012 |
| WO | WO 2006/085615 A1 | 8/2006 |
| WO | WO 2008/035406 A1 | 3/2008 |
| WO | WO 2011/065138 A1 | 6/2011 |

* cited by examiner

WHITE ORGANIC LIGHT EMITTING DIODE DEVICE

This application claims priority and the benefit of Korean Patent Application No. 10-2013-0091063 filed on Jul. 31, 2013, which is hereby incorporated by reference for all purposes as if fully set forth herein.

BACKGROUND OF THE INVENTION

1. Field of the Invention

One or more embodiments of the invention relates to an organic light emitting diode device, and more particularly, to a tandem organic light emitting diode device.

2. Discussion of the Related Art

Recently, flat panel displays (FPDs) are becoming increasingly important with the development of multimedia. Accordingly, several planar display devices, such as a liquid crystal display (LCD), a plasma display panel (PDP), a field emission display (FED), and an organic light emitting diode (OLED) device have been practical. In particular, the OLED device has a high-speed response of 1 ms or less, low power consumption, and self-light emitting characteristics. Also, the OLED device has a merit as a moving picture display media irrespective of the size of the display because it does not have a viewing angle problem. Further, the OLED device is being considered as the next generation flat panel display because it can be fabricated at a low temperature and is simply manufactured based on the existing semiconductor process technology.

The OLED device includes a light emitting layer between a first electrode and a second electrode. Here, a hole supplied from the first electrode is coupled with an electron received from the second electrode in the light emitting layer to form an exciton, and light is emitted by the energy generated while the exciton returns to the ground state.

The OLED device has been developed to have various structures, among which a tandem type white OLED device is becoming of interest. In the tandem OLED device, respective layers between the first electrode and the second electrode are deposited without masks, and the organic layers including light emitting layers are sequentially formed by depositing different compositions under vacuum conditions. In this white OLED device, white light is implemented by mixing colors of two or more light emitting layers. In this case, different light emitting layers that emit multiple color lights are provided between the first electrode and the second electrode, and stacks are differentiated based on a basic structure in which a charge generation layer is provided between each two adjacent light emitting layers.

However, the tandem white OLED device has problems in that the multiple light emitting layers respectively emitting different colors make it difficult to implement white light through the control of the light emitting efficiencies among the colors, and the light emitting efficiencies need to be improved.

SUMMARY OF THE INVENTION

Various embodiments of the invention provides an organic light emitting diode device capable of improving lifespan, light emitting efficiency, and driving voltage characteristics.

In one aspect, there is a white organic light emitting diode device, comprising first and second electrodes facing each other above a substrate, first and second charge generation layers formed between the first electrode and the second electrode, a first stack disposed between the first electrode and the first charge generation layer and including a first light emitting layer, a second stack disposed between the first charge generation layer and the second charge generation layer and including a second light emitting layer, and a third stack disposed between the second charge generation layer and the second electrode and including a third light emitting layer, wherein two of the first to third light emitting layers emit a blue light and the rest light emitting layer emits yellow-green light.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to various embodiments of the invention, examples of which are illustrated in the accompanying drawings. Wherever possible, the same reference numbers will be used throughout the drawings to refer to the same or like parts. It will be paid attention that detailed description of known arts will be omitted if the arts may lead to misunderstanding of the embodiments of the invention.

Figure 1:
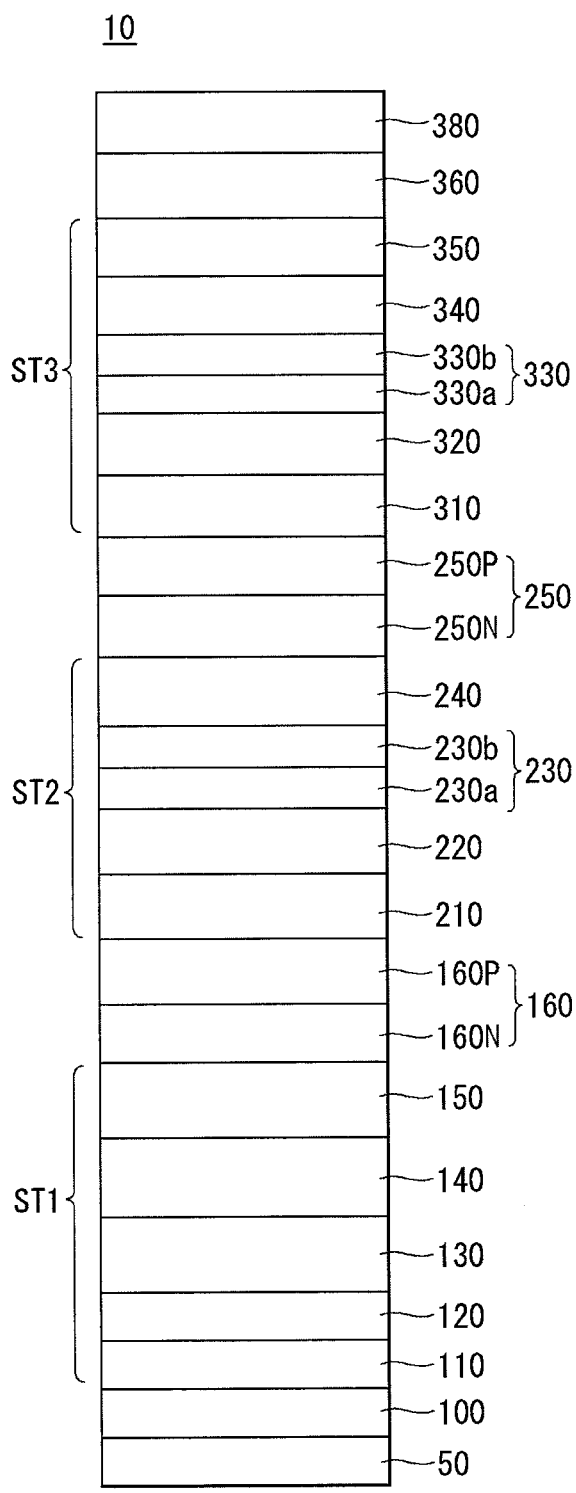
FIG. 1 is a diagram showing an organic light emitting diode device according to an embodiment of the present invention.

FIG. 1 is a diagram showing an organic light emitting diode device according to an embodiment of the present invention.

Referring to FIG. 1, an organic light emitting diode device 10 of the present invention includes stacks ST1, ST2, and ST3 positioned between a first electrode 100 and a second electrode 380 above a substrate 50, and includes a first charge generation layer 160 and a second charge generation layer 250 each positioned between each two pair of stacks ST1, ST2, and ST3.

More specifically, the substrate 50 is formed of light-transmissible transparent glass, a plastic material, or a conductive material. The first electrode 100 positioned on the substrate 50 is an anode electrode, and formed of any one of indium tin oxide (ITO), indium zinc oxide (IZO), and zinc oxide (ZnO), for example.

The first stack ST1 positioned on the first electrode 100 constitutes one light emitting device unit, and includes a first light emitting layer 140. The first light emitting layer 140 may include at least a light emitting layer emitting a blue light, or may further include a light emitting layer emitting a red light. Here, the first light emitting layer 140 emitting a blue light may be formed of a fluorescent or phosphorescent material. For example, when the first light emitting layer 140 is formed of a fluorescent material, it may include an anthracene derivative, a stylvene derivative, a pyrene derivative, or a carbazole derivative. As the stylvene derivative, compounds represented by the following chemical formulas may be used:

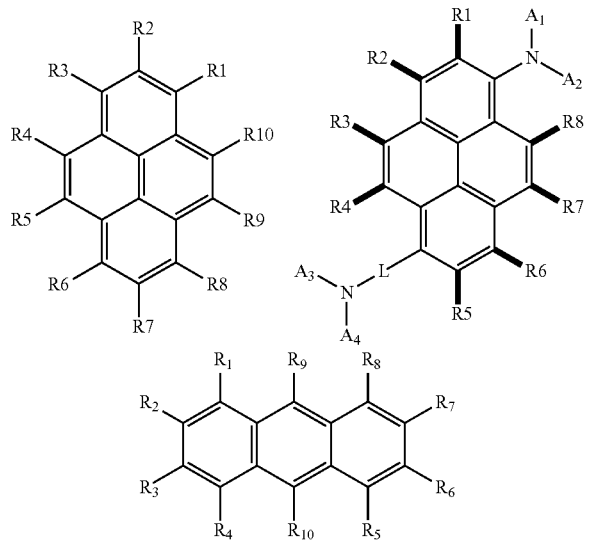

In the above chemical formulas, Rn (n=1~10) may be selected from the group consisting of a substituted or unsubstituted aryl group with 6 to 24 carbon atoms, a substituted or unsubstituted condensed aryl group with 10 to 30 carbon atoms, a substituted or unsubstituted heteroaryl group with 2 to 24 carbon atoms, a substituted or unsubstituted alkyl group with 1 to 24 carbon atoms, a substituted or unsubstituted heteroalkyl group with 1 to 24 carbon atoms, a substituted or unsubstituted cycloalkyl group with 3 to 24 carbon atoms, a substituted or unsubstituted alkoxy group with 1 to 24 carbon atoms, a substituted or unsubstituted aryloxy group with 6 to 24 carbon atoms, a substituted or unsubstituted alkylsilyl group with 1 to 24 carbon atoms, a substituted or unsubstituted arylsilyl group with 6 to 24 carbon atoms, a cyano group, a halogen group, deuterium, and hydrogen; and the aryl group may be selected from the group consisting of phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole, and pyrrole.

Each L is independently a substituted or unsubstituted aryl group with 6 to 40 carbon atoms or a substituted or unsubstituted heteroaryl group with 3 to 20 carbon atoms; each of substituents of L and A1 to A4 may be selected from the group consisting of a substituted or unsubstituted alkyl group with 1 to 24 carbon atoms, a substituted or unsubstituted cycloalkyl group with 3 to 24 carbon atoms, a substituted or unsubstituted alkoxy group with 1 to 24 carbon atoms, a cyano group, a halogen group, a substituted or unsubstituted aryl group with 6 to 24 carbon atoms, a substituted or unsubstituted aryloxy group with 6 to 24 carbon atoms, a substituted or unsubstituted heteroaryl group with 2 to 24 carbon atoms, a substituted or unsubstituted aryl amino group with 6 to 40 carbon atoms, a substituted or unsubstituted alkyl amino group with 2 to 40 carbon atoms, a germanium group, a boron group, a substituted or unsubstituted alkylsilyl group with 1 to 24 carbon atoms, a substituted or unsubstituted arylsilyl group with 6 to 40 carbon atoms, and deuterium.

In addition, for example, when the first light emitting layer 140 is formed of a phosphorescent material, a host may include an anthracene derivative, a stylvene derivative, a pyrene derivative, or a carbazole derivative. As a substituent of the host, compounds represented by the following chemical formulas may be used:

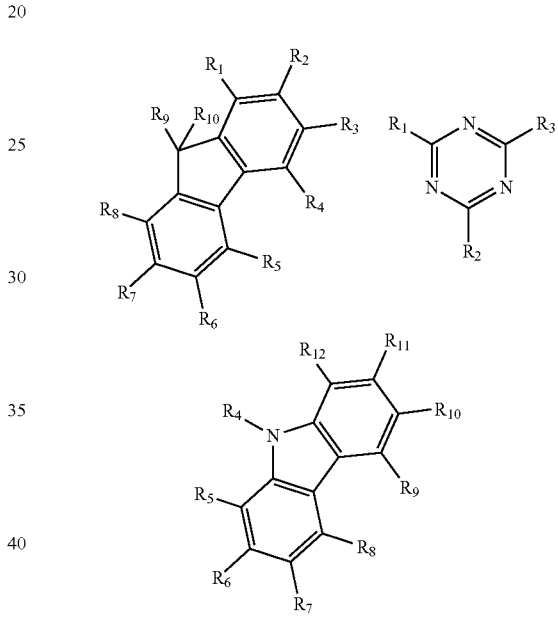

In the above chemical formulas, Rn (n=1~12) may be selected from the group consisting of a substituted or unsubstituted aryl group with 6 to 24 carbon atoms, a substituted or unsubstituted condensed aryl group with 10 to 30 carbon atoms, a substituted or unsubstituted heteroaryl group with 2 to 24 carbon atoms, a substituted or unsubstituted alkyl group with 1 to 24 carbon atoms, a substituted or unsubstituted heteroalkyl group with 1 to 24 carbon atoms, a substituted or unsubstituted cycloalkyl group with 3 to 24 carbon atoms, a substituted or unsubstituted alkoxy group with 1 to 24 carbon atoms, a substituted or unsubstituted aryloxy group with 6 to 24 carbon atoms, a substituted or unsubstituted alkylsilyl group with 1 to 24 carbon atoms, a substituted or unsubstituted arylsilyl group with 6 to 24 carbon atoms, a cyano group, a halogen group, deuterium, and hydrogen; and $R_1$ to $R_{12}$ may form a condensed ring together with a neighboring substituent.

The substituent may be a substituted or unsubstituted, fused or unfused aryl group, and may be formed by one to five multiple substitutions or non-multiple substitutions on a core structure consisting of phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole, or pyrrole.

As a dopant, materials represented by the following chemical formulas may be used. Particularly, metal compounds in which three of N—N, N—O, or O—O bonds coordinate to the central metal Ir as shown below may be used.

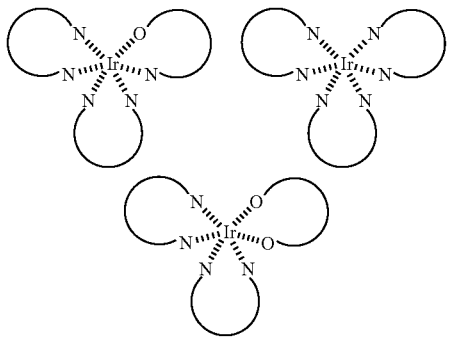

The first light emitting layer 140 may contain one host and one dopant or two hosts and one dopant. Here, between the two hosts, one may be a hole transportive host and the other may be an electron transportive host. As the hole transportive host, a material of the forgoing hole transport layer may be used, and as the electron transportive host, a material of the electron transport layer may be used.

In accordance with one or more embodiments, when the first light emitting layer 140 further includes a light emitting layer emits a red light, the red light emitting layer may contain, for example, at least one host selected from CBP (4,4'-N,N'-dicarbazolebiphenyl) and Balq (Bis(2-methyl-8-quinlinolato-N1,O8)-(1,1'-Biphenyl-4-olato)aluminium), and at least one red phosphorescent dopant selected from Ir(Mnpy)₃, Btp2Ir(acac)(bis(2O-benzo[4,5-a]thienyl)pyridinato-N,C3O)iridium(zcetylactonate), and Btp2Ir(acac)(iridium(III)bis(1-phenylisoquinolyl)-N,C2')acetyl.

The blue light emitting layer or the red light emitting layer of the first light emitting layer 140 may contain one host and one dopant or two hosts and one dopant. In addition, when the first light emitting layer 140 has a lamination structure of a blue light emitting layer and a red light emitting layer, the red light emitting layer may be disposed on the blue light emitting layer or the blue light emitting layer may be disposed on the red light emitting layer.

In addition, the first stack (ST1) may further include a hole injection layer (HIL) 110, a first hole transport layer (HTL) 120, and a first electron blocking layer (EBL) 130, between the first electrode 100 and the first light emitting layer 140. The hole injection layer 110 may serve to facilitate the injection of holes into the first light emitting layer 140 from the first electrode 110, and may be formed of at least one selected from the group consisting of CuPc (cupper phthalocyanine), PEDOT (poly(3,4)-ethylenedioxythiophene), PANI (polyaniline), and NPD (N,N-dinaphthyl-N,N'-diphenyl benzidine), but is not limited thereto.

The first hole transport layer 120 may serve to facilitate the transport of holes, and may be formed of at least one selected from the group consisting of NPD (N,N-dinaphthyl-N,N'-diphenyl benzidine), TPD (N,N'-bis-(3-methylphenyl)-N,N'-bis-(phenyl)-benzidine), s-TAD, and MTDATA (4,4',4"-Tris (N-3-methylphenyl-N-phenyl-amino)-triphenylamine), but is not limited thereto. For example, the first hole transport layer 120 may be formed of a compound represented by the following chemical formula:

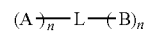

Wherein A and B may be selected from compounds represented by the following chemical formulas:

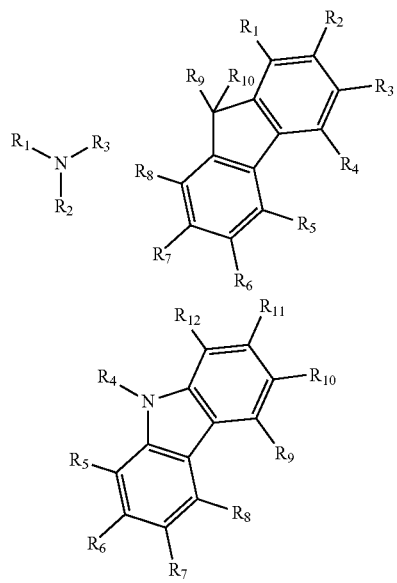

In the above chemical formulas, Rn (n=1~12) may be selected from the group consisting of a substituted or unsubstituted aryl group with 6 to 24 carbon atoms, a substituted or unsubstituted condensed aryl group with 10 to 30 carbon atoms, a substituted or unsubstituted heteroaryl group with 2 to 24 carbon atoms, a substituted or unsubstituted alkyl group with 1 to 24 carbon atoms, a substituted or unsubstituted heteroalkyl group with 1 to 24 carbon atoms, a substituted or unsubstituted cycloalkyl group with 3 to 24 carbon atoms, a substituted or unsubstituted alkoxy group with 1 to 24 carbon atoms, a substituted or unsubstituted aryloxy group with 6 to 24 carbon atoms, a substituted or unsubstituted alkylsilyl group with 1 to 24 carbon atoms, a substituted or unsubstituted arylsilyl group with 6 to 24 carbon atoms, a cyano group, a halogen group, deuterium, and hydrogen; and $R_1$ to $R_{12}$ may form a condensed ring together with a neighboring substituent. L represents an aryl group, and may be selected from the group consisting of phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole, and pyrrole.

The first electron blocking layer 130 contains a material of the hole transport layer and a metal or a meal compound so as to prevent electrons generated in the light emitting layer from going into the hole transport layer. Therefore, the LUMO level of the first electron blocking layer 130 gets higher, and thus the electrons cannot go over the first electron blocking layer 130. The first hole transport layer 120 and the first electron blocking layer 130 may be a single layer in which respective materials thereof are mixed.

In addition, the first stack ST1 further includes a first electron transport layer (ETL) 150 on the first light emitting layer 140. The first electron transport layer 150 serves to facilitate the transport of electrons, and may be formed of at least one selected from the group consisting of Alq3(tris(8-hydroxyquinolino)aluminum), PBD, TAZ, spiro-PBD, BAlq, and SAlq, but is not limited thereto.

For example, the first electron transport layer 150 may be formed of compounds represented by the following chemical formulas:

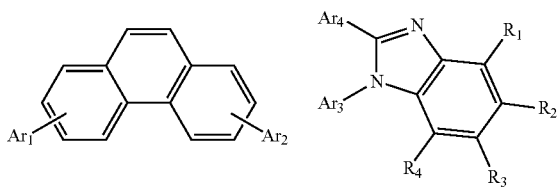

$Ar_1$ to $Ar_4$ each represent an aryl group, and may be selected from the group consisting of phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole, and pyrrole In the above chemical formulas, Rn (n=1~4) may be selected from the group consisting of a substituted or unsubstituted aryl group with 6 to 24 carbon atoms, a substituted or unsubstituted condensed aryl group with 10 to 30 carbon atoms, a substituted or unsubstituted heteroaryl group with 2 to 24 carbon atoms, a substituted or unsubstituted alkyl group with 1 to 24 carbon atoms, a substituted or unsubstituted heteroalkyl group with 1 to 24 carbon atoms, a substituted or unsubstituted cycloalkyl group with 3 to 24 carbon atoms, a substituted or unsubstituted alkoxy group with 1 to 24 carbon atoms, a substituted or unsubstituted aryloxy group with 6 to 24 carbon atoms, a substituted or unsubstituted alkylsilyl group with 1 to 24 carbon atoms, a substituted or unsubstituted arylsilyl group with 6 to 24 carbon atoms, a cyano group, a halogen group, deuterium, and hydrogen.

Therefore, the first stack ST1 including the hole injection layer 110, the first hole transport layer 120, the first electron blocking layer 130, the first light emitting layer 140, and the first electron transport layer 150 is formed on the first electrode 100.

A first charge generation layer (CGL) 160 is disposed on the first stack ST1. The first charge generation layer 160 may be a PN junction charge generation layer in which a N-type charge generation layer 160N and a P-type charge generation layer 160P are joined to each other. Here, the PN junction charge generation layer 160 generates charges or separates them into holes and electrons, and then injects the charges into the respective light emitting layers. That is, the N-type charge generation layer 160N supplies electrons to the first light emitting layer 140 adjoining the first electrode, and the P-type charge generation layer 160P supplies holes a light emitting layer of the second stack ST2, thereby further improving the light emitting efficiency of the organic light emitting diode device including a plurality of light emitting layers.

Here, the P-type charge generation layer 160P may be formed of a single material, or a single material doped with a P-type dopant. The P-type charge generation layer 160P may be formed of at least one single material selected from the group consisting of fluorine-substituted TCNPQ, a TCNPQ derivative having a Cyan group, Radiallene-based compounds, Quinone-based compounds, and compounds represented by Chemical Formula (I):

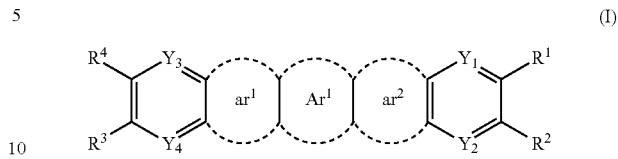

$X^1$ and $X^2$ each may be selected from the group consisting of S, N and O.

Substituents of Chemical Formula (I) above may be compounds represented by Chemical Formula (I) and (ii) below:

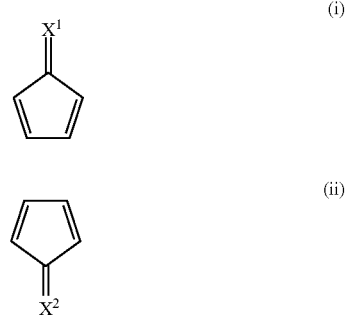

The compounds represented by Chemical Formulas (i) and (ii) above may be substituted with substituents represented by Chemical Formula (a) to (g) below:

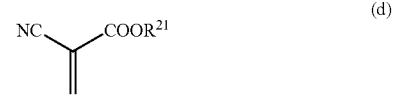

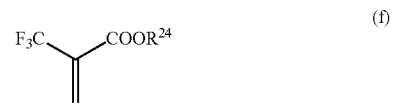

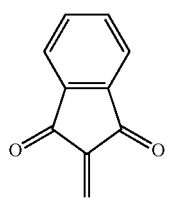

(g)

In the above Chemical Formula (I), $ar_1$ and $ar_2$ each may be selected from the group consisting of substituted or unsubstituted phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole, and pyrrole. And in the above Chemical Formula (I), $Y^1, Y^2, Y^3$ and $Y^4$ each may be selected from the group consisting of S, N and O.

In addition, when the P-type charge generation layer 160P is doped with a P-type dopant, the P-type dopant may be metal oxide, fluorine-substituted TCNPQ, a TCNPQ derivative having a Cyan group, Radiallene-based compounds, Quinone-based compounds, and compounds represented by the following chemical formulas.

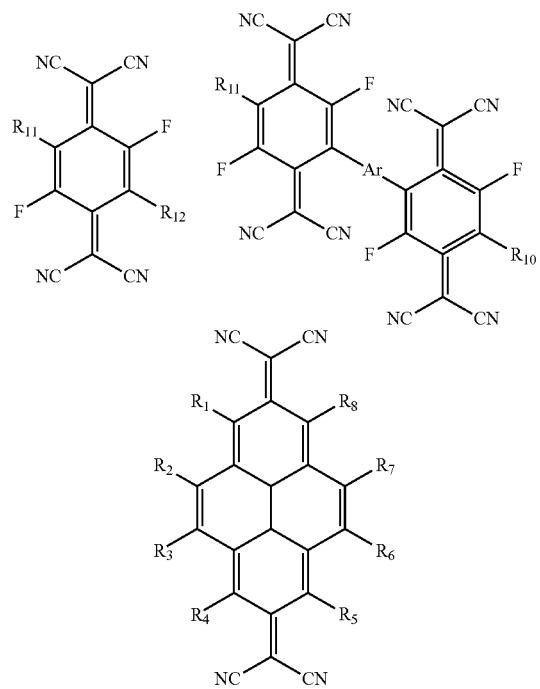

In the above chemical formulas, Ar may be selected from the group consisting of substituted or unsubstituted phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, Pyridine, pyrazole, imidazole, and pyrrole, and compounds represented by $R_1$ to $R_{12}$ below.

$R_1$ to $R_{12}$ may be selected from compounds represented by H, $CF_3$, and compounds represented by the following chemical formulas. In the below, A and B may be selected from H, F, and $CF_3$.

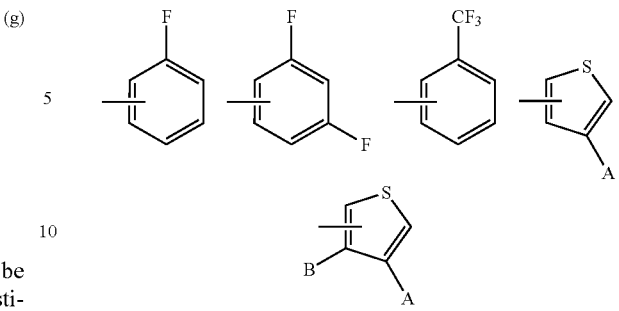

The N-type charge generation layer 160N may be formed of a metal or an N-type doped organic material. Here, the metal may be one material selected from the group consisting of Li, Na, K, Rb, Cs, Mg, Ca, Sr, Ba, La, Ce, Sm, Eu, Tb, Dy, and Yb. In addition, as an N-type dopant and a host material, which are used in the N-type doped organic material, materials that can be conventionally used may be used. For example, the N-type dopant may be an alkali metal, an alkali metal compound, an alkali earth metal, or an alkali earth metal compound. Specifically, the N-type dopant may be one selected from the group consisting of Cs, K, Rb, Mg, Na, Ca, Sr, Eu, and Yb. The host material may be one material selected from the group consisting of tris(8-hydroxyquinoline)aluminum, triazine, a hydroxyquinoline derivative, a benzazole derivative, and a silole derivative.

In accordance with one or more embodiments, the second stack ST2 including a second light emitting layer 230 is disposed on the first charge generation layer 160. The second light emitting layer 230 includes, for example, a light emitting layer emitting a yellow-green light, and may further include a light emitting layer emitting a green light. The present embodiment will be described based on a second light emitting layer 230 including a yellow-green light emitting layer 230a and a green light emitting layer 230b.

The green light emitting layer 230b may contain at least one host selected from CBP (4,4'-N,N'-dicarbazolebiphenyl) and Balq (Bis(2-methyl-8-quinlinolato-N1,O8)-(1,1'-Biphenyl-4-olato)aluminium), and a green phosphorescent dopant of $Ir(ppy)_3$. The yellow-green light emitting layer 230a may contain at least one host selected from CBP (4,4'-N,N'-dicarbazolebiphenyl) and Balq (Bis(2-methyl-8-quinlinolato-N1, O8)-(1,1'-Biphenyl-4-olato)aluminium), and a yellow-green phosphorescent dopant emitting a yellow-green light. In one embodiment, the host materials of the yellow-green light emitting layer 230a and the green light emitting layer 230b may be the same material as the hole transport layer.

At least one of the yellow-green light emitting layer 230a and the green light emitting layer 230b of the second light emitting layer 230 may contain two hosts and one dopant. In addition, when the second light emitting layer 230 has a lamination structure of the yellow-green light emitting layer 230a and the green light emitting layer 230b, the green light emitting layer 230b may be disposed on the yellow-green light emitting layer 230a or the green light emitting layer 230b may be disposed on the yellow-green light emitting layer 230a. In addition, the yellow-green light emitting layer 230a and the green light emitting layer 230b of the second light emitting layer 230 may be one single layer. Here, the second light emitting layer with a single layer may be formed by mixing one host with a yellow-green dopant and a green dopant or mixing two hosts with a yellow-green dopant and a green dopant. Here, between the two hosts, one may be a hole transportive host and the other may be an electron transportive host. As the hole transportive host, a material of the forgoing hole transport layer may be used, and as the electron transportive host, a material of the electron transport layer may be used.

In addition, in the second light emitting layer 230, the peak of the emission spectrum of the yellow-green light emitting layer 230a may be present in a wavelength band of 550 to 570 nm, and the peak of the emission spectrum of the green light emitting layer 230b may be present in a wavelength band of 530 to 550 nm. Here, the full width half maximum values of the respective spectra have 700 nm or higher, respectively, thereby improving the efficiencies of yellow-green color and green color.

In addition, the yellow-green light emitting layer 230a and the green light emitting layer 230b are formed to have a thickness of 400 Å or thinner, thereby preventing the rise in the driving voltage and improving the light emitting efficiency. In addition, the yellow-green light emitting layer 230a and the green light emitting layer 230b may have different doping concentrations. The doping concentration may be different or the same between the light emitting layer near to the hole transport layer and the light emitting layer far from the hole transport layer.

The second stack (ST2) further includes a second hole transport layer 210 and a second electron blocking layer 220 between the first charge generation layer 160 and the second light emitting layer 230. The second hole transport layer 210 is the same as the first hole transport layer 120, and they may be formed of different materials or the same material. Also, the second electron blocking layer 220 is the same as the first electron blocking layer 130, and they may be formed of different materials or the same material. In addition, the second stack ST2 further includes a second electron transport layer 240 on the second light emitting layer 230. The second electron transport layer 240 is the same as the first electron transport layer 150 of the first stack ST1, and they may be formed of different materials or the same material. Therefore, the second stack ST2 including the second hole transport layer 210, the second electron blocking layer 220, the second light emitting layer 230, and the second electron transport layer 240 may be formed on the first charge generation layer 160.

A second charge generation layer 250 may be disposed on the second stack ST2. The second charge generation layer 250 may be a PN junction charge generation layer in which an N-type charge generation layer 250N and a P-type charge generation layer 250P are joined to each other, and may have the same structure as the first charge generation layer 160. However, the second charge generation layer 250 and the first charge generation layer 160 may be formed of different materials. For example, the P-type charge generation layer 160P of the first charge generation layer 160 may be formed of a single material, and the P-type charge generation layer 250P of the second charge generation layer 250 may be formed of a single material doped with a P-type dopant.

In accordance with one or more embodiments, a third stack ST3 including a third light emitting layer 30 is disposed on the second charge generation layer 250. The third light emitting layer 330 may include at least a light emitting layer emitting a blue light, and may further include a light emitting layer emitting a red light. The third light emitting layer 330 may have the same structure as the first light emitting layer 140 of the first stack ST1. For example, the third light emitting layer 330 may have a lamination structure of a blue light emitting layer 330a emitting a blue light and a red light emitting layer 330b emitting a red light.

The third stack (ST3) further includes a third hole transport layer 310 and a third electron blocking layer 320 between the second charge generation layer 250 and the third light emitting layer 330. The third hole transport layer 310 is the same as the first hole transport layer 120, and they may be formed of different materials or the same material. Also, the third electron blocking layer 320 is the same as the first electron blocking layer 130, and they may be formed of different materials or the same material.

In addition, the third stack ST3 further includes, on the third light emitting layer 330, a third electron transport layer 340, a fourth electron transport layer 350, and an electron injection layer 360. The four electron transport layer 350 is the same as the first electron transport layer 150 of the first stack ST1, and they may be formed of different materials or the same material. The third electron transport layer 340 may be formed by mixing an electron injection material having an excellent electron injection capability and a hole blocking material having an excellent hole blocking capability. Here, the mixing ratio of the electron injection material and the hole blocking material may be in the range of 1:99 to 99:1, and preferably 30:70 to 70:30.

The electron injection layer (EIL) 360 serves to facilitate the injection of electrons, and may be formed of Alq3(tris(8-hydroxyquinolino)aluminum), PBD, TAZ, spiro-PBD, BAlq, or SAlq, but is not limited thereto. In addition, the electron injection layer 360 may be formed of a metal halide compound, for example, at least one selected from the group consisting of $MgF_2$, LiF, NaF, KF, RbF, CsF, FrF, and $CaF_2$, but is not limited thereto. Therefore, the third stack ST3 including the third hole transport layer 310, the third electron blocking layer 320, the third light emitting layer 330, and the third electron transport layer 340, the third electron transport layer 350, and the electron injection layer 360 may be formed on the second charge generation layer 250.

A second electrode 380 may be disposed on the third stack ST3. The second electrode 380 may be a cathode electrode, and may be formed of aluminum (Al), magnesium (Mg), silver (Ag), or an alloy thereof, which has a low work function. Therefore, an organic light emitting diode device includes the first to third stacks ST1, ST2, and ST3 and the first and second charge generation layers 160 and 250 between the first electrode 100 and the second electrode 380.

The organic light emitting diode device is manufactured such that the distance between the first electrode 100 and the second electrode 380 is 2500 to 5000 Å and the distance between the second electrode 380 and the second light emitting layer 230 is at least 2000 Å, thereby securing the viewing angle of the image and the light emitting efficiency of the red light.

Although the present embodiment has been described that the first light emitting layer and the third light emitting layer include a blue light emitting layer and the second light emitting layer includes a yellow-green light emitting layer, the present invention is not limited thereto. The position of the second light emitting layer may be changed with the position of the third light emitting layer.

Hereinafter, examples of the organic light emitting diode device according to the present invention will be set forth. However, the following examples are provided merely to illustrate the present invention, and thus the present invention is not limited thereto. Various structures and effects of the light emitting diode devices of the present invention will be described through various examples to be set forth below.

Example 1-1

An ITO substrate was patterned to have a light emitting area of 2 mm×2 mm, and then washed. The substrate was mounted in a vacuum chamber and the base pressure was made to be 1×10⁻⁶ torr. NPD with a thickness of 100 Å for a hole injection layer was formed on an anode ITO. An aryl amine-based material with a thickness of 1200 Å for a hole transport layer was formed thereon, and a carbazole-based material with a thickness of 200 Å for an electron blocking layer was formed thereon. For a blue fluorescent layer, an anthracene-based material with a thickness of 250 Å as a host and a pyrene-based material with a doping concentration of 5% as a dopant were formed thereon. Then, a heteroaryl-based material with a thickness of 200 Å for an electron transport layer was formed thereon, so that a first stack was formed. After that, for an N-type charge generation layer, a heteroaryl-based material with a thickness of 200 Å as a host and an alkali earth metal material with a doping concentration of 3% as a dopant were formed. A heteroaryl-based material with a thickness of 200 Å for a P-type charge generation layer was formed thereon. An aryl amine-based material with a thickness of 200 Å for a hole transport layer of was formed thereon. A carbazole-based material with a thickness of 200 Å for an electron blocking layer was formed. Then, for a yellow-green phosphorescent layer, one heteroaryl-based host material with a thickness of 150 Å, another host material with a thickness of 150 Å, and an iridium compound with a doping concentration of 20% as a dopant were formed. Then, for a green phosphorescent layer, one heteroaryl-based host material with a thickness of 150 Å, another host material with a thickness of 150 Å, and an iridium compound with a doping concentration of 15% as a dopant were formed. Then, a heteroaryl-based material with a thickness of 200 Å for an electron transport layer was formed thereon, so that a second stack was formed. Then, for an N-type charge generation layer, a heteroaryl-based material with a thickness of 200 Å as a host and an alkali earth metal material with a doping concentration of 3% as a dopant were formed. A heteroaryl-based material with a thickness of 200 Å for a P-type charge generation layer was formed, and then an aryl amine-based material with a thickness of 1200 Å for a hole transport layer was formed. In addition, a carbazole-based material with a thickness of 200 Å for an electron blocking layer was formed. Then, for a blue fluorescent layer, an anthracene-based material with a thickness of 200 Å as a host and a pyrene-based material with a doping concentration of 5% as a dopant were formed. Then, for a red phosphorescent layer, a heteroaryl-based host material with a thickness of 100 Å, a carbazole and aryl amine-based host material with a thickness of 100 Å, and an iridium compound with a doping concentration of 3% as a dopant were formed. Then, a heteroaryl-based material with a thickness of 200 Å for an electron transport layer was formed, and then a heteroaryl-based material with a thickness of 200 Å for the electron transport layer was again formed. Then, LiF with a thickness of 10 Å for an electron injection layer was formed, so that a third stack was formed. Then, Al with a thickness of 2000 Å for a cathode was formed, so that an organic light emitting diode device was manufactured.

Example 1-2

An organic light emitting diode device was manufactured under the same conditions as the example 1-1 except that the position of the blue fluorescent layer was changed with the position of the red phosphorescent layer.

As for Example 1-1 and Example 1-2, emission spectra were measured and then shown in FIG. 2, and light emitting efficiencies of R, G, B, and W, driving voltage, and lifespan were measured and then shown in Table 1 below.

TABLE 1

|  |  | Example 1-2 | Example 1-1 |
|---|---|---|---|
| Light emitting efficiency (Cd/A) | R | 14.5 | 8.4 |
|  | G | 44.2 | 39.6 |
|  | B | 3.2 | 3.3 |
|  | W | 90.5 | 78.5 |
| Driving voltage (10 mA/cm²) |  | 11.5 | 11.4 |
| Lifespan (T95@3000 nit) |  | 1000 | 2300 |

Figure 2:
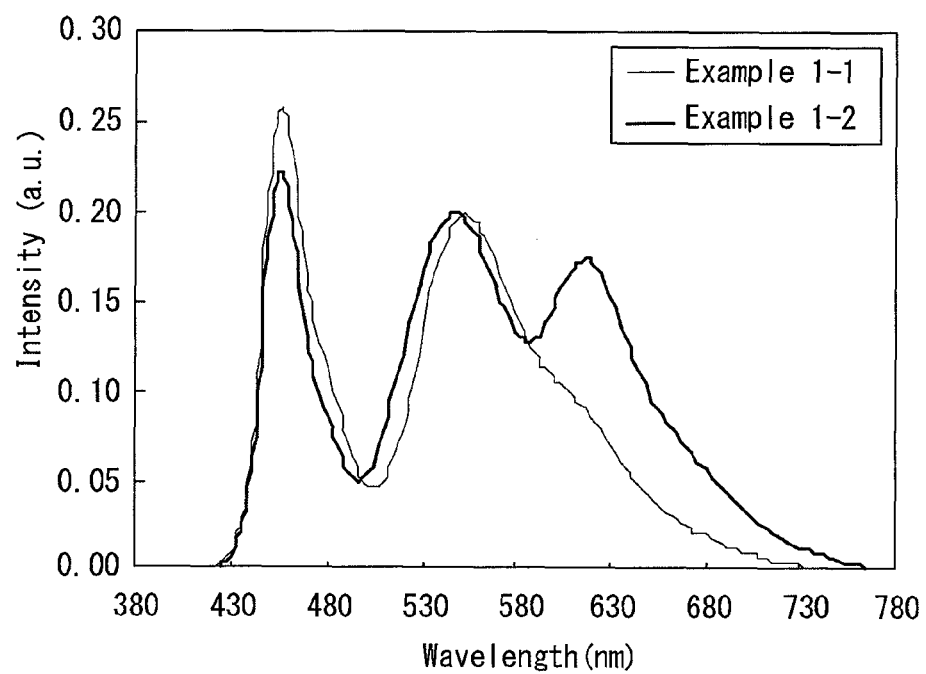
FIG. 2 is a graph showing emission spectra measured according to Examples 1-1 and 1-2 of the present invention.

Referring to FIG. 2 and Table 1, the third stack structure was provided with both the red phosphorescent layer and the blue fluorescent layer, thereby improving the entire panel characteristics, and a long-wavelength red phosphorous layer was disposed adjacent to the cathode, thereby improving the light emitting efficiency.

Example 2-1

An organic light emitting diode device was manufactured under the same conditions as the Example 1-1 except that the red phosphorescent layer was excluded from the third stack.

Example 2-2

An organic light emitting diode device was manufactured under the same conditions as the Example 2-1 except that the green light emitting layer of the second stack was excluded.

As for Example 2-1 and Example 2-2, emission spectra were measured and then shown in FIG. 3, and light emitting efficiencies of R, G, B, and W, driving voltage, and lifespan were measured and then shown in Table 2 below.

TABLE 2

|  |  | Example 2-1 | Example 2-2 |
|---|---|---|---|
| Light emitting efficiency (Cd/A) | R | 7.0 | 7.1 |
|  | G | 40.8 | 42.3 |
|  | B | 4.2 | 4.3 |
|  | W | 89.0 | 91.6 |
| Driving voltage (10 mA/cm²) |  | 11.6 | 12.1 |

Figure 3:
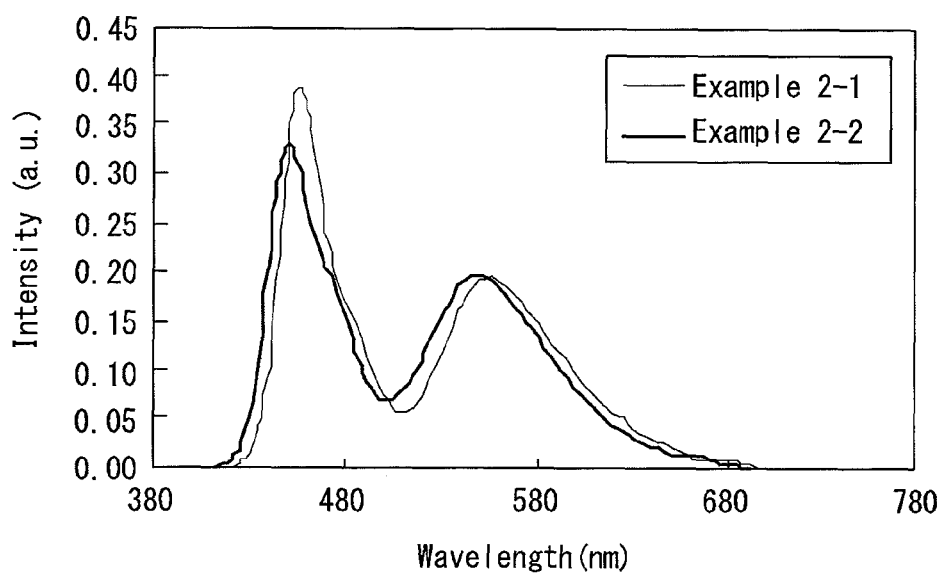
FIG. 3 is a graph showing emission spectra measured according to Examples 2-1 and 2-2 of the present invention.

Referring to FIG. 3 and Table 2, the second stack was provided with both the yellow-green light emitting layer and the green light emitting layer instead of one yellow-green light emitting layer, thereby improving light emitting efficiency and driving voltage characteristics.

Example 3-1

An organic light emitting diode device was manufactured under the same conditions as the example 1-1 except that the green light emitting layer of the second stack and the red light emitting layer of the third stack were excluded.

Example 3-2

An organic light emitting diode device was manufactured under the same conditions as the Example 3-1 except that the hole transport layer and the electron blocking layer of the first stack were formed of a single material to have a thickness of 1150 Å.

As for Example 3-1 and Example 3-2, emission spectra were measured and then shown in FIG. 4, and light emitting efficiencies of R, G, B, and W and driving voltage were measured and then shown in Table 3 below.

TABLE 3

|  |  | Example 3-1 | Example 3-2 |
|---|---|---|---|
| Light emitting | R | 7.9 | 8.4 |
| efficiency (Cd/A) | G | 34.6 | 34.4 |
|  | B | 4.2 | 4.1 |
|  | W | 81.1 | 82.4 |
| Driving voltage (10 mA/cm$^2$) |  | 12.1 | 12.1 |

Figure 4:
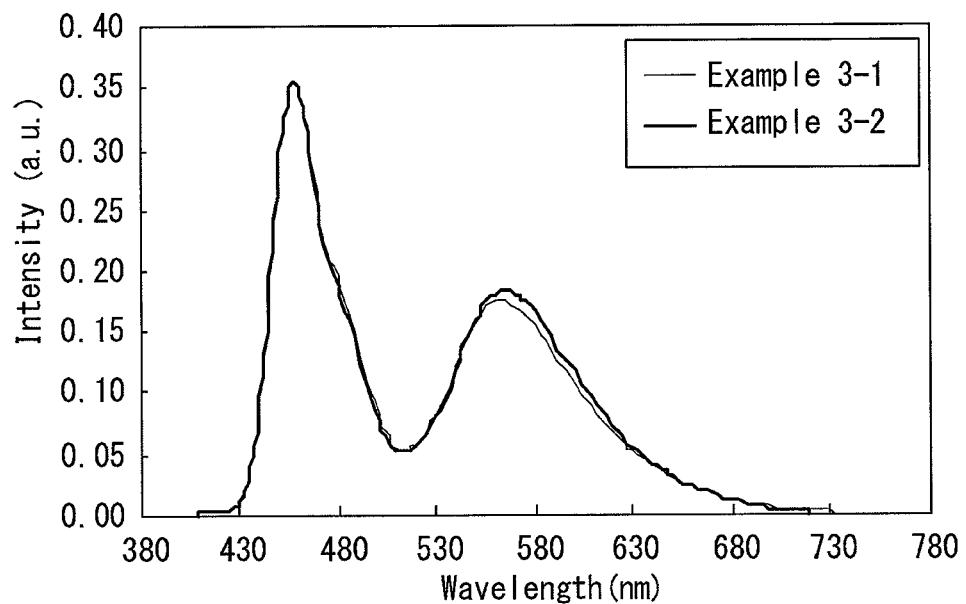
FIG. 4 is a graph showing emission spectra measured according to Examples 3-1 and 3-2 of the present invention.

Referring to FIG. 4 and Table 3, the hole transport layer and the electron blocking layer of the first stack were formed as a single layer, thereby lowering the thickness of the organic light emitting diode device and improving the light emitting efficiency.

Example 4-1

An organic light emitting diode device was manufactured under the same conditions as the Example 3-1 except that the blue light emitting layer of the first stack and the blue light emitting layer of the third stack each were formed of an anthracene-based host material with a thickness of 100 Å and a pyrene-based compound with a doping concentration of 5% as a dopant.

Example 4-2

An organic light emitting diode device was manufactured under the same conditions as the Example 3-1 except that the blue light emitting layer of the first stack was formed of an anthracene-based host material with a thickness of 100 Å, another anthracene-based host material with a thickness of 100 Å, and a pyrene-based compound with a doping concentration of 5% as a dopant, and the blue light emitting layer of the third stack was formed of an anthracene-based host material with a thickness of 100 Å, another anthracene-based host material with a thickness of 100 Å, and a pyrene-based compound with a doping concentration of 5% as a dopant.

Example 4-3

An organic light emitting diode device was manufactured under the same conditions as the Example 3-1 except that the blue light emitting layer of the first stack was formed of an anthracene-based host material with a thickness of 100 Å, another anthracene-based host material with a thickness of 100 Å, and a pyrene-based compound with a doping concentration of 5% as a dopant, and the blue light emitting layer of the third stack was formed of an anthracene-based host material with a thickness of 100 Å and a pyrene-based compound with a doping concentration of 5% as a dopant.

Example 4-4

An organic light emitting diode device was manufactured under the same conditions as the Example 3-1 except that the blue light emitting layer of the first stack was formed of an anthracene-based host material with a thickness of 100 Å and a pyrene-based compound material with a doping concentration of 5% as a dopant, and the blue light emitting layer of the third stack was formed of an anthracene-based host material with a thickness of 100 Å, another anthracene-based host material with a thickness of 100 Å, and a pyrene-based compound with a doping concentration of 5% as a dopant.

As for Examples 4-1 to 4-4, emission spectra were measured and then shown in FIG. 5, and light emitting efficiencies of R, G, B, and W, driving voltage, and lifespan were measured and then shown in Table 4 below.

TABLE 4

|  |  | Example 4-1 | Example 4-2 | Example 4-3 | Example 4-4 |
|---|---|---|---|---|---|
| Light | R | 7.8 | 7.8 | 7.8 | 7.8 |
| emitting | G | 36.7 | 36.6 | 37.4 | 37.3 |
| efficiency | B | 4.2 | 4.0 | 4.1 | 4.2 |
| (Cd/A) | W | 84.2 | 84.1 | 85.3 | 85.3 |
| Driving voltage (10 mA/cm$^2$) |  | 12.4 | 11.8 | 11.9 | 12.0 |
| Lifespan | R | 900 | 1000 | 900 | 1000 |
| (T95, h) | G | 1000 | 1100 | 1000 | 1100 |
|  | B | 1600 | 1900 | 1900 | 2300 |
|  | W | 1400 | 1500 | 1400 | 1700 |

Figure 5:
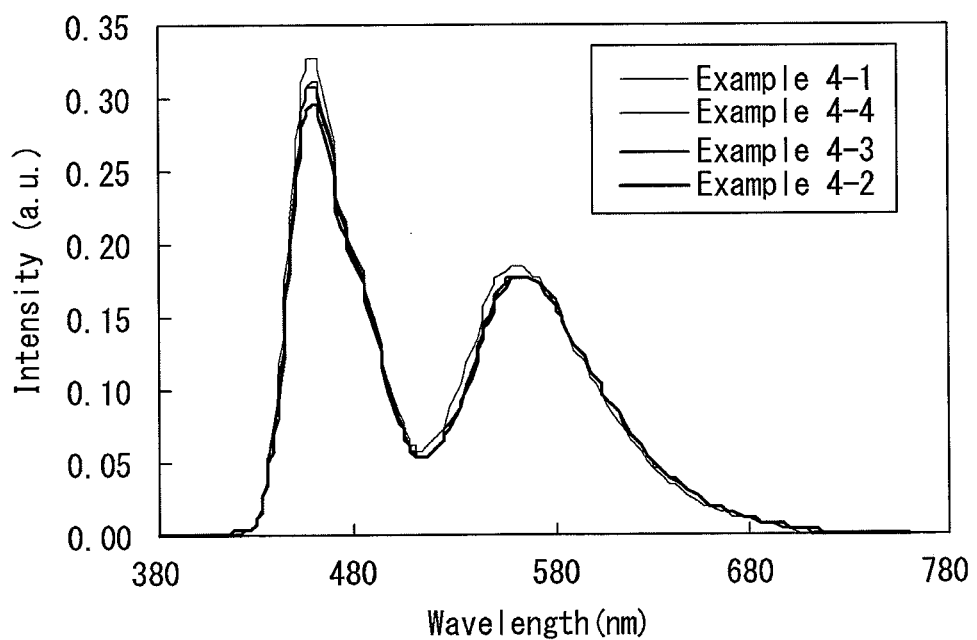
FIG. 5 is a graph showing emission spectra measured according to Examples 4-1 to 4-4 of the present invention.

Referring to FIG. 5 and Table 4, the driving voltage and the lifespan were further improved when the blue light emitting layer adopts a single host as compared with when the blue light emitting layer adopts two hosts.

Example 5-1

An organic light emitting diode device was manufactured under the same conditions as the Example 1-1 except that the green light emitting layer of the second stack and the red light emitting layer of the third stack were excluded.

Example 5-2

An organic light emitting diode device was manufactured under the same conditions as the Example 5-1 except that two electron transport layers of the third stack were co-deposited as a single layer with a thickness of 360 Å.

As for Example 5-1 and Example 5-2, emission spectra were measured and then shown in FIG. 6, and light emitting efficiencies of R, G, B, and W, driving voltage, and lifespan were measured and then shown in Table 5 below.

TABLE 5

|  |  | Example 5-1 | Example 5-2 |
|---|---|---|---|
| Light emitting | R | 43.6 | 44.8 |
| efficiency (Cd/A) | G | 4.3 | 4.4 |
|  | B | 91.9 | 94.9 |
|  | W | 27.3 | 28.3 |
| Lifespan (T95@3000 nit) |  | 3700 | 4100 |
| Driving voltage (10 mA/cm$^2$) |  | 12.2 | 12.4 |

Figure 6:
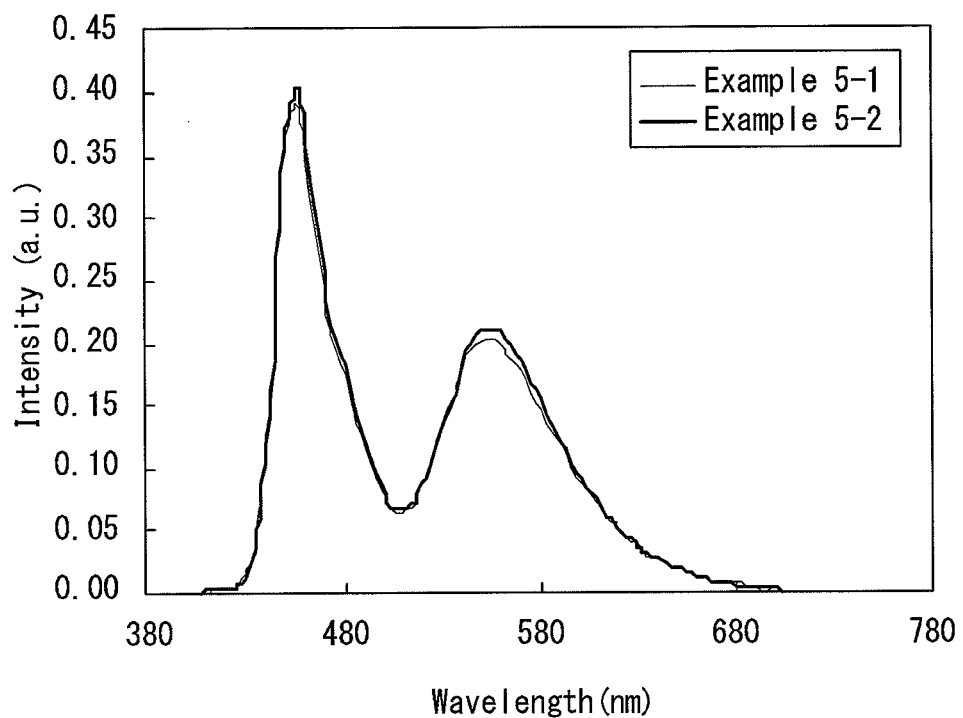
FIG. 6 is a graph showing emission spectra measured according to Examples 5-1 and 5-2 of the present invention.

Referring to FIG. 6 and Table 5, the materials for the two hole transport layers of the third stack were mixed and then used to form a single layer, thereby lowering the thickness of the organic light emitting diode device and improving the lifespan and driving voltage characteristics.

Example 6-1

An organic light emitting diode device was manufactured under the same conditions as the Example 1-1 except that the green light emitting layer of the second stack and the red light emitting layer of the third stack were excluded.

Example 6-2

An organic light emitting diode device was manufactured under the same conditions as the Example 6-1 except that the electron blocking layer, the hole transport layer, and the P-type charge generation layer of the second stack were formed as a single layer by forming an aryl amine and carbazole-based host material with a thickness of 50 Å and a P-type dopant compound with a doping concentration of 10%, and then depositing the same aryl amine-based host material with a thickness of 250 Å.

As for Example 6-1 and Example 6-2, emission spectra were measured and then shown in FIG. 7, and light emitting efficiencies of R, G, B, and W, driving voltage, and lifespan were measured and then shown in Table 6 below.

TABLE 6

|  |  | Example 6-1 | Example 6-2 |
|---|---|---|---|
| Light emitting efficiency (Cd/A) | R | 7.1 | 7.8 |
|  | G | 41.0 | 37.9 |
|  | B | 4.2 | 4.2 |
|  | W | 89.7 | 86.2 |
| Driving voltage (10 mA/cm$^2$) |  | 12.2 | 12.0 |
| Lifespan (T95, h) | R | 1300 | 1800 |
|  | G | 1400 | 1800 |
|  | B | 2900 | 3100 |
|  | W | 2100 | 2700 |

Figure 7:
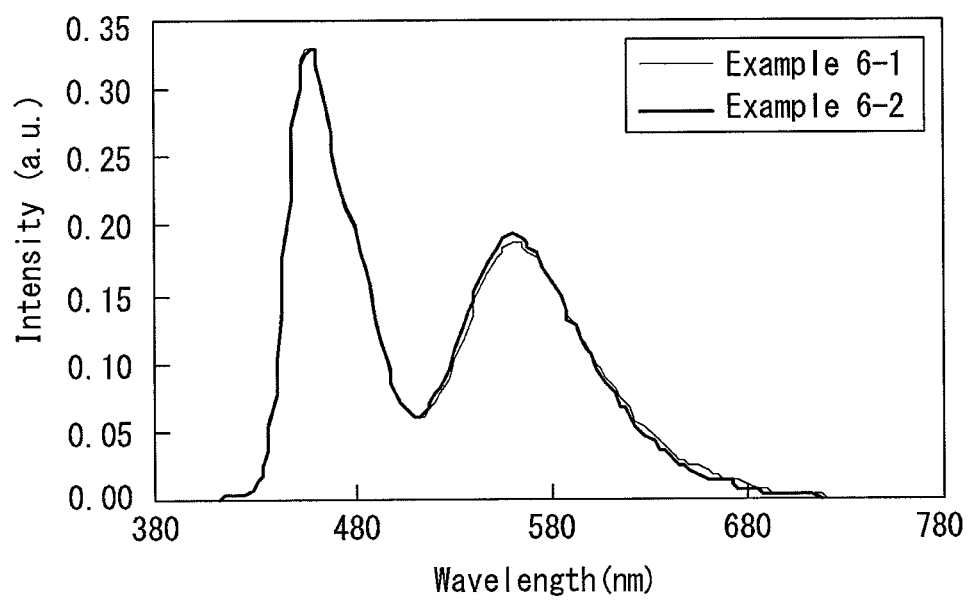
FIG. 7 is a graph showing emission spectra measured according to Examples 6-1 and 6-2 of the present invention.

Referring to FIG. 7 and Table 6, the thickness of the organic light emitting diode device was lowered and the lifespan and driving voltage characteristics were further improved when the electron blocking layer, the hole transport layer, and the P-type charge generation layer of the second stack were formed as a single layer of P-type doping layer, as compared with when the respective layers were formed in the second stack.

Example 7-1

An organic light emitting diode device was manufactured under the same condition as the Example 6-2.

Example 7-2

An organic light emitting diode device was manufactured under the same conditions as the Example 7-1 except that the electron blocking layer, the hole transport layer, and the P-type charge generation layer of the third stack were formed as a single layer by forming an aryl amine and carbazole-based host material with a thickness of 50 Å and a P-type dopant compound with a doping concentration of 10%, and then depositing the same aryl amine-based host material with a thickness of 250 Å.

Example 7-3

An organic light emitting diode device was manufactured under the same conditions as the Example 7-2 except that a host different from the aryl amine-based host was used.

As for Examples 7-1 to 7-3, emission spectra were measured and then shown in FIG. 8, and light emitting efficiencies of R, G, B, and W, driving voltage, and lifespan were measured and then shown in Table 7 below.

TABLE 7

|  |  | Example 7-1 | Example 7-2 | Example 7-3 |
|---|---|---|---|---|
| Light emitting efficiency (Cd/A) | R | 7.8 | 7.6 | 7.6 |
|  | G | 36.1 | 37.3 | 37.1 |
|  | B | 4.1 | 4.1 | 4.1 |
|  | W | 83.5 | 84.8 | 84.5 |

TABLE 7-continued

|  |  | Example 7-1 | Example 7-2 | Example 7-3 |
|---|---|---|---|---|
| Driving voltage (10 mA/cm$^2$) |  | 12.0 | 11.9 | 12.9 |
| Lifespan (T95, h) | R | 2200 | 2800 | 2900 |
|  | G | 2500 | 3100 | 3200 |
|  | B | 2400 | 2600 | 2500 |
|  | W | 2600 | 3300 | 3300 |

Figure 8:
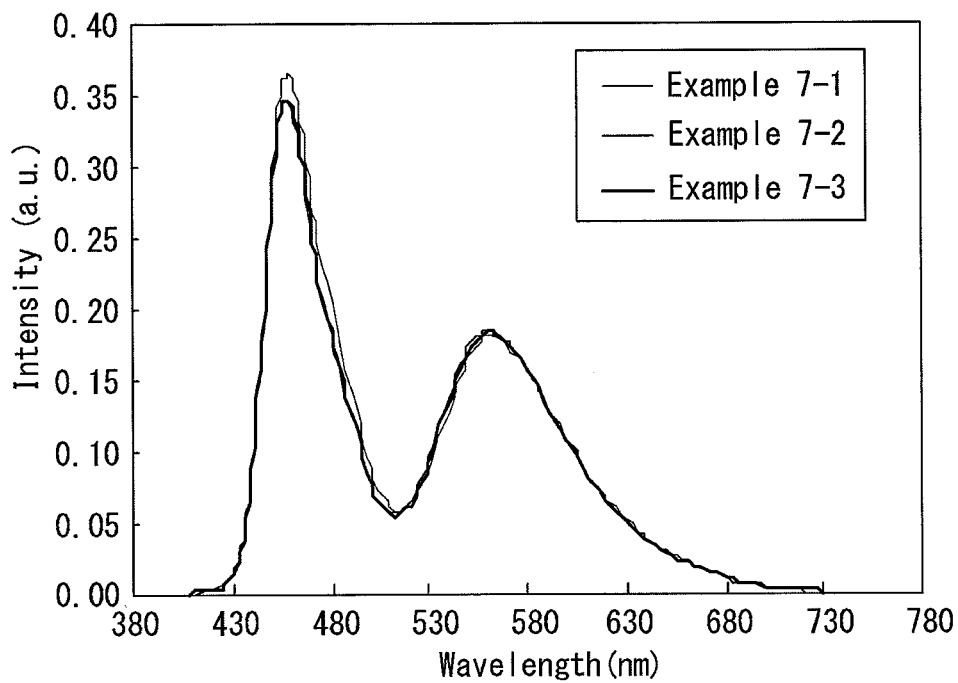
FIG. 8 is a graph showing emission spectra measured according to Examples 7-1 to 7-3 of the present invention.

Referring to FIG. 8 and Table 7, the thickness of the organic light emitting diode device was lowered and the lifespan and driving voltage characteristics were further improved when the electron blocking layer, the hole transport layer, and the P-type charge generation layer of the third stack were formed of a single layer of P-type doping layer, together with the second stack, as compared with when the respective were formed in the third stack.

Example 8-1

An organic light emitting diode device was manufactured under the same conditions as the Example 6-2 except that the yellow-green phosphorescent light emitting layer and the green phosphorescent layer each were formed of one heteroaryl-based host material with a thickness of 120 Å, another host material with a thickness of 120 Å, and an iridium compound with a doping concentration of 8% as a dopant.

Example 8-2

An organic light emitting diode device was manufactured under the same conditions as the Example 8-1 except that, instead of the heteroaryl-based host, a compound of which the LUMO level gap from the electron transport layer is 0.3 eV or smaller was used as a host.

As for Example 8-1 and Example 8-2, emission spectra were measured and then shown in FIG. 9, and light emitting efficiencies of R, G, B, and W, driving voltage, and lifespan were measured and then shown in Table 8 below.

TABLE 8

|  |  | Example 8-1 | Example 8-2 |
|---|---|---|---|
| Light emitting efficiency (Cd/A) | R | 6.2 | 6.3 |
|  | G | 32.9 | 34.0 |
|  | B | 3.9 | 3.9 |
|  | W | 73.8 | 76.1 |
| Driving voltage (10 mA/cm$^2$) |  | 12.6 | 13.2 |
| Lifespan (T95, h) | R | 3600 | 4800 |
|  | G | 4200 | 6000 |
|  | B | 3400 | 3800 |
|  | W | 4200 | 5600 |

Figure 9:
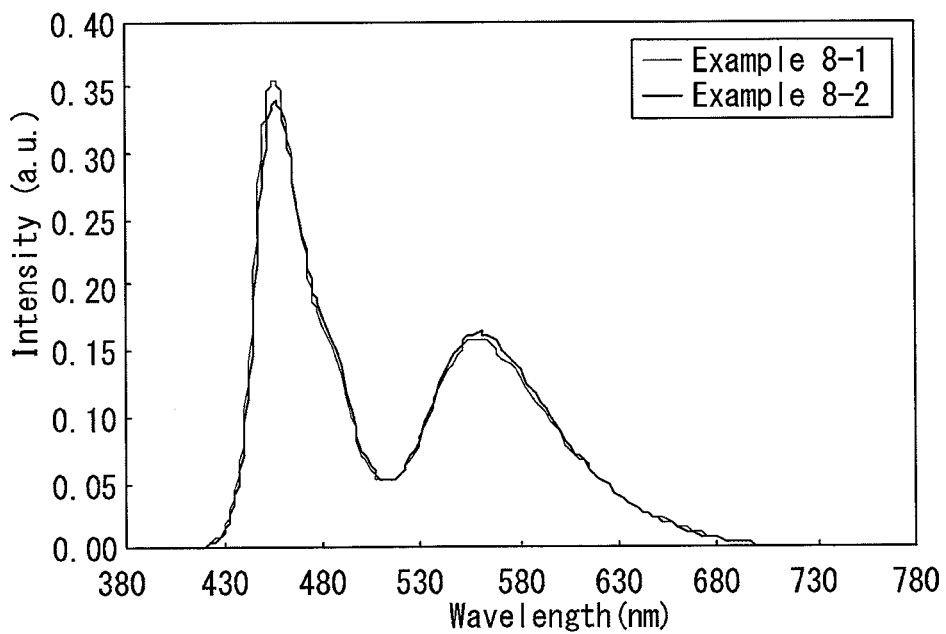
FIG. 9 is a graph showing emission spectra measured according to Examples 8-1 and 8-2 of the present invention.

Referring to FIG. 9 and Table 8, as the LUMO level gap of the host of the green light emitting layer from the electron transport layer becomes smaller, the light emitting efficiency and the lifespan were further improved.

Example 9-1>

An organic light emitting diode device was manufactured under the same condition as the Example 6-2 except that the thickness of the electron transport layer of the first stack was 70 Å.

Example 9-2

An organic light emitting diode device was manufactured under the same condition as the Example 9-1 except that the thickness of the electron transport layer of the first stack was 110 Å.

Example 9-3

An organic light emitting diode device was manufactured under the same condition as the Example 9-1 except that the thickness of the electron transport layer of the first stack was 150 Å.

As for Examples 9-1 to 9-3, emission spectra were measured and then shown in FIG. 10, and light emitting efficiencies of R, G, B, and W, driving voltage, and lifespan were measured and then shown in Table 9 below.

TABLE 9

|  |  | Example 9-1 | Example 9-2 | Example 9-3 |
|---|---|---|---|---|
| Light emitting efficiency (Cd/A) | R | 7.9 | 8.1 | 7.6 |
|  | G | 35.7 | 35.9 | 39.0 |
|  | B | 4.1 | 4.1 | 4.2 |
|  | W | 82.4 | 83.1 | 87.4 |
| Driving voltage (10 mA/cm$^2$) |  | 12.0 | 12.0 | 12.1 |
| Lifespan (T95, h) | R | 4400 | 4000 | 3900 |
|  | G | 4700 | 4000 | 3900 |
|  | B | 3400 | 3200 | 3400 |
|  | W | 4600 | 3800 | 3900 |

Figure 10:
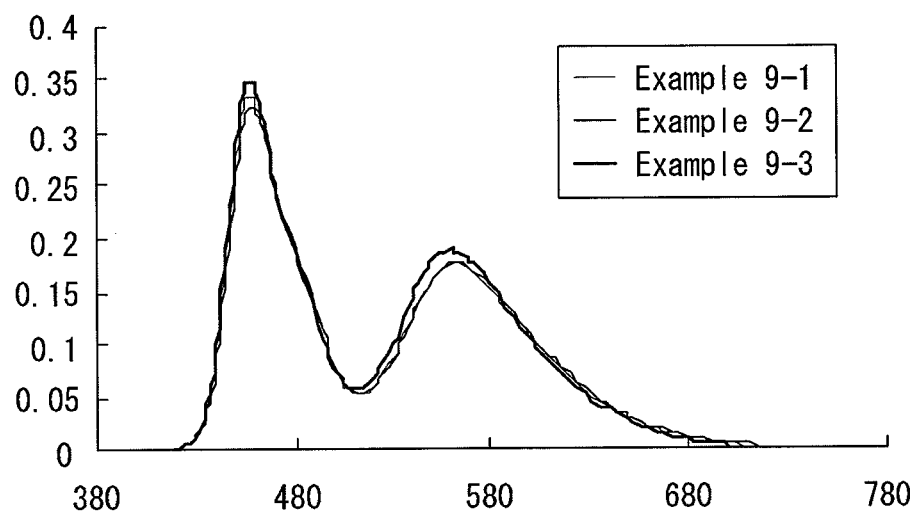
FIG. 10 is a graph showing emission spectra measured according to Examples 9-1 to 9-3 of the present invention.

Referring to FIG. 10 and Table 9, as the thickness of the electron transport layer of the first stack becomes smaller, the lifespan was increased and the efficiency was further improved.

Example 10-1

An organic light emitting diode device was manufactured under the same condition as the Example 6-2 except that the thickness of the N-type charge generation layer of the first stack was 80 Å.

Example 10-2

An organic light emitting diode device was manufactured under the same condition as the Example 10-1 except that the thickness of the N-type charge generation layer of the first stack was 120 Å.

Example 10-3

An organic light emitting diode device was manufactured under the same condition as the Example 10-1 except that the thickness of the N-type charge generation layer of the first stack was 150 Å.

As for Examples 10-1 to 10-3, emission spectra were measured and then shown in FIG. 11, and light emitting efficiencies of R, G, B, and W, driving voltage, and lifespan were measured and then shown in Table 10 below.

TABLE 10

|  |  | Example 10-1 | Example 10-2 | Example 10-3 |
|---|---|---|---|---|
| Light emitting efficiency (Cd/A) | R | 8.0 | 8.1 | 7.5 |
|  | G | 35.5 | 35.9 | 38.3 |
|  | B | 4.2 | 4.1 | 4.1 |
|  | W | 82.3 | 83.1 | 85.8 |
| Driving voltage (10 mA/cm$^2$) |  | 12.0 | 12.0 | 12.0 |
| Lifespan (T95, h) | R | 3400 | 3600 | 3900 |
|  | G | 3600 | 4000 | 4100 |
|  | B | 3000 | 3200 | 3300 |
|  | W | 3600 | 3800 | 4100 |

Figure 11:
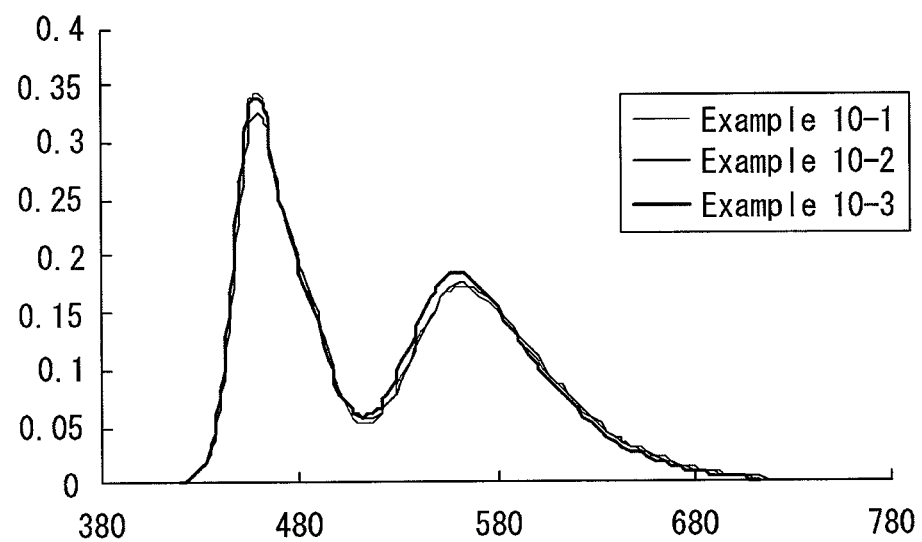
FIG. 11 is a graph showing emission spectra measured according to Examples 10-1 to 10-3 of the present invention.

Referring to FIG. 11 and Table 10, as the thickness of the N-type charge generation layer of the first stack becomes greater, the lifespan was increased, but the thickness thereof is preferably 300 Å or smaller.

Example 11-1

An organic light emitting diode device was manufactured under the same condition as the Example 6-2 except that the thickness of the electron transport layer of the second stack was 480 Å.

Example 11-2

An organic light emitting diode device was manufactured under the same condition as the Example 11-1 except that the thickness of the electron transport layer of the second stack was 350 Å.

As for Example 11-1 and Example 11-2, emission spectra were measured and then shown in FIG. 12, and light emitting efficiencies of R, G, B, and W, driving voltage, and lifespan were measured and then shown in Table 11 below.

TABLE 11

|  |  | Example 11-1 | Example 11-2 |
|---|---|---|---|
| Light emitting efficiency (Cd/A) | R | 7.9 | 7.7 |
|  | G | 33.4 | 34.4 |
|  | B | 4.3 | 4.3 |
|  | W | 79.0 | 80.2 |
| Driving voltage (10 mA/cm$^2$) |  | 12.2 | 11.9 |
| Lifespan (T95, h) | R | 1100 | 1500 |
|  | G | 1300 | 1600 |
|  | B | 1900 | 2000 |
|  | W | 1900 | 2400 |

Figure 12:
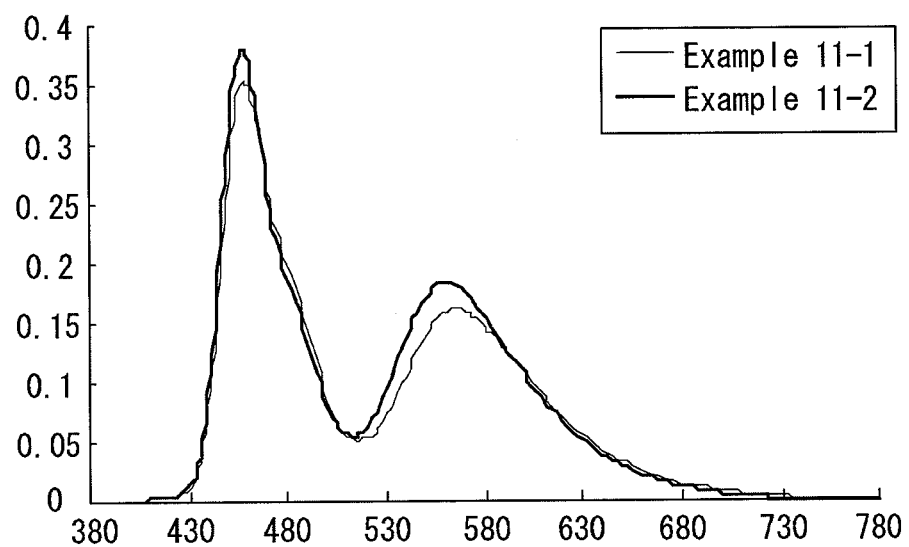
FIG. 12 is a graph showing emission spectra measured according to Examples 11-1 and 11-2 of the present invention.

Referring to FIG. 12 and Table 11, as the thickness of the electron transport layer of the second stack becomes smaller, the lifespan was further increased and the driving voltage was further reduced.

As described above, the organic light emitting diode device according to an embodiment of the present invention includes at least three stacks, at least two blue light emitting layers, and one yellow-green light emitting layer, thereby improving the lifespan and light emitting efficiencies and improving driving voltage characteristics, and realizing white color.

Further, according to the organic light emitting diode device of the present invention, the distance between the first electrode and the second electrode is 2500 to 5000 Å and the distance between the second electrode 380 and the second light emitting layer is 2000 Å or greater, thereby securing the viewing angle of the image and the light emitting efficiency of the red light.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A white organic light emitting diode device, comprising:
   first and second electrodes facing each other above a substrate;
   first and second charge generation layers formed between the first electrode and the second electrode;
   a first stack disposed between the first electrode and the first charge generation layer and including a first light emitting layer;
   a second stack disposed between the first charge generation layer and the second charge generation layer and including a second light emitting layer; and
   a third stack disposed between the second charge generation layer and the second electrode and including a third light emitting layer,
   wherein two of the first to third light emitting layers emit a blue light and the remaining light emitting layer emits a yellow-green light, and
   wherein at least one of the second light emitting layer and the third light emitting layer has a two-layer structure.

2. The white organic light emitting diode device of claim 1, wherein at least one of the first charge generation layer and the second charge generation layer has a junction structure of an N-type charge generation layer and a P-type charge generation layer.

3. The white organic light emitting diode device of claim 1, wherein the first light emitting layer is a blue fluorescent layer.

4. The white organic light emitting diode device of claim 1, wherein the first to third light emitting layers have a structure in which two dopants are mixed with one host and two dopants are mixed with two hosts.

5. The white organic light emitting diode device of claim 4, wherein in the two hosts, one is an electron transportive host and the other is a hole transportive host.

6. The white organic light emitting diode device of claim 1, wherein the distance between the first electrode and the second electrode is 2500 to 5000 Å.

7. The white organic light emitting diode device of claim 6, wherein the distance between the second electrode and the second light emitting layer is 2000 Å or greater.

8. The white organic light emitting diode device of claim 1, wherein at least one of the two light emitting layers emitting a blue light further includes a light emitting layer emitting a red light.

9. The white organic light emitting diode device of claim 1, wherein each layer of the two-layer structure has a thickness of 400 Å or smaller.

10. The white organic light emitting diode device of claim 1, wherein the two-layer structure includes a yellow-green light emitting layer and a green light emitting layer.

11. A white organic light emitting diode device, comprising:
    first and second electrodes facing each other above a substrate;
    first and second charge generation layers formed between the first electrode and the second electrode;
    a first stack disposed between the first electrode and the first charge generation layer and including a first light emitting layer;
    a second stack disposed between the first charge generation layer and the second charge generation layer and including a second light emitting layer; and
    a third stack disposed between the second charge generation layer and the second electrode and including a third light emitting layer,
    wherein two of the first to third light emitting layers emit a blue light and the remaining light emitting layer emits a yellow-green light, and
    wherein the first to third stacks each further include a hole transport layer and an electron blocking layer.

12. The white organic light emitting diode device of claim 11, wherein the hole transport layer and the electron blocking layer are formed as a single layer.

13. A white organic light emitting diode device, comprising:
    first and second electrodes facing each other above a substrate;
    first and second charge generation layers formed between the first electrode and the second electrode;
    a first stack disposed between the first electrode and the first charge generation layer and including a first light emitting layer;
    a second stack disposed between the first charge generation layer and the second charge generation layer and including a second light emitting layer; and
    a third stack disposed between the second charge generation layer and the second electrode and including a third light emitting layer,
    wherein two of the first to third light emitting layers emit a blue light and the remaining light emitting layer emits a yellow-green light, and
    wherein the third stack further includes an electron transport layer disposed between the third light emitting layer and the second electrode and adjoining the third light emitting layer, the electron transport layer containing an electron injection material mixed with a hole blocking material.

* * * * *